United States Patent [19]

Slotboom et al.

[11] Patent Number: 4,907,049

[45] Date of Patent: Mar. 6, 1990

[54] CHARGE-COUPLED SEMICONDUCTOR DEVICE HAVING AN IMPROVED ELECTRODE STRUCTURE

[75] Inventors: Jan W. Slotboom; Henricus G. R. Maas; Kazimierz Osinki; Geert J. T. Davids, all of Eindhoven, Netherlands

[73] Assignee: U.S. Philips Corp., New York, N.Y.

[21] Appl. No.: 385,928

[22] Filed: Jul. 27, 1989

Related U.S. Application Data

[63] Continuation of Ser. No. 161,263, Feb. 17, 1988, abandoned, which is a continuation of Ser. No. 858,477, May 1, 1986, abandoned.

[30] Foreign Application Priority Data

May 10, 1985 [NL] Netherlands .......................... 8501338

[51] Int. Cl.[4] ...................... H01L 29/78; H01L 29/06; H01L 23/48
[52] U.S. Cl. .......................................... 357/24; 357/55; 357/67; 357/71
[58] Field of Search ................... 357/24, 715, 675, 55, 357/59 G, 59 R, 24 LR, 24 M

[56] References Cited

U.S. PATENT DOCUMENTS

| | | | |
|---|---|---|---|
| 4,053,349 | 10/1977 | Simko | 357/24 |
| 4,055,885 | 11/1977 | Takemoto | 357/24 |
| 4,358,340 | 11/1982 | Fu | 357/67 S |
| 4,449,287 | 5/1984 | Maas et al. | 29/580 |
| 4,636,826 | 1/1987 | Slotboom et al. | 357/24 |

FOREIGN PATENT DOCUMENTS

| | | | |
|---|---|---|---|
| 52-50691 | 4/1977 | Japan | 357/24 |
| 54-27113 | 9/1979 | Japan | 357/24 |
| 56-91471 | 7/1981 | Japan | 357/24 |

Primary Examiner—Andrew J. James
Assistant Examiner—Ngan Van Ngo
Attorney, Agent, or Firm—Steven R. Biren

[57] ABSTRACT

A charge-coupled semiconductor device has a plurality of silicon electrodes for storing and transporting information-carrying charge, which electrodes are located on an insulating layer and are mutually separated by grooves having a width of at most 1 μm. According to the invention, transfer electrodes are arranged in the grooves, these electrodes being coplanar with the remaining electrodes. The thickness of the insulating layer under the transfer electrodes is substantially equal to that under the storage electrodes. The invention also relates to a method of manufacturing a semiconductor device having such an electrode system.

4 Claims, 4 Drawing Sheets

CHARGE-COUPLED SEMICONDUCTOR DEVICE HAVING AN IMPROVED ELECTRODE STRUCTURE

This is a continuation of application Ser. No. 161,263, filed Feb. 17, 1988 now abandoned which is a continuation of application Ser. No. 858,477, filed May 1, 1986, now abandoned.

BACKGROUND OF THE INVENTION

The invention relates to a charge-coupled semi-conductor device having a plurality of electrodes for storing and transporting information-carrying charge, these electrodes being in the form of coplanar silicon strips which are formed from a single silicon layer and are located on an insulating layer and are mutually separated by grooves filled at least in part with silicon oxide and having a width of at most 1 μm, which is narrower than the silicon strips.

The invention further relates to a method of manufacturing such a device.

A charge-coupled semiconductor device of the kind described above and a method of manufacturing such a device are known from U.S. Pat. No. 4,449,287.

The method according to that U.S. patent specification permits manufacturing charge-coupled semi-conductor devices having very small memory cells, in which the electrodes used for the charge transport are located at a very small relative distance (less than 1 μm) and in one plane so that they need not overlap each other. The electrodes are mutually separated by very narrow grooves or slots, which are most often thermally oxidized. The grooves are so narrow that they are often filled completely with oxide.

Apart from the electrodes used for charge storage (designated hereinafter as storage electrodes), one or more other electrodes are often required in a charge-coupled semiconductor device, normally designated as CCD (short for "Charge-Coupled Device"). These electrodes, which are designated as transfer electrodes, are not used for charge storage, but are intended to cause the potential to vary in the direction of the charge transport in such a manner that the charge is transported in the desired direction.

Such transfer electrodes are located between the storage electrodes, and consequently require an additional amount of space. Moreover, they are often at least in part situated in a plane different from that of the storage electrodes. Since in the method according to U.S. Pat. No. 4,449,287 the smallest possible dimensions per memory cell are aimed at, this may be a great disadvantage. If the transfer electrodes are not located in the same plane as the storage electrodes, step coverage problems may additionally arise during the metallization process.

SUMMARY OF THE INVENTION

The invention has inter alia for its object to provide a charge-coupled semiconductor device of the kind described, in which the presence of transfer electrodes substantially does not require an additional amount of space and in which the transfer electrodes are located substantially in the same plane as the storage electrodes, while the thickness of the insulating layer under the transfer electrodes is substantially equal to that under the storage electrodes, which is desirable in certain cases.

The invention has further for its object to provide a very efficacious method of forming such transfer electrodes.

According to the invention, a charge-coupled semiconductor device of the kind described above is characterized in that the grooves are situated between storage electrodes, while between at least two storage electrodes the groove wall is oxidized only superficially and the groove is further filled by a transfer electrode consisting of conductive material, the thickness of the insulating layer under the transfer electrode being substantially equal to that under the storage electrodes.

The invention is based inter alia on the recognition of the fact that the very narrow spaces between the electrodes, instead of being closed by oxidation, can be used to arrange transfer electrodes therein because these transfer electrodes, since they do not serve for charge storage, can be very narrow.

Such a transfer electrode may consist of various conductive materials, for example of silicon or at least in part of a metal silicide or may contain a metal, such as, for example, tungsten. Furthermore, when the semicondcutor device is a so-called series/parallel/series memory (SPS memory), the transfer electrode may form the connection between a series register and parallel register.

The invention further relates to a very efficacious method of manufacturing the charge-coupled semi-conductor device. According to the method known from U.S. Pat. No. 4,449,287, a first silicon layer, an oxidation-preventing layer and a second silicon layer are successively applied to an electrically insulating layer, after which the second silicon layer is etched according to a pattern comprising a number of parallel silicon strips and the second silicon layer is then partly oxidized to form an oxidized edge portion thereof, whereupon the uncovered parts of the oxidation-preventing layer and the exposed silicon oxide are etched away, a thermal oxidation is carried out, the uncovered parts of the oxidation-preventing layer are etched away selectively and grooves are etched through the parts of the first silicon layer thus exposed to form a number of electrodes serving for charge transport. Between at least two electrodes the groove wall is then ozidized only superficially, whereupon an electrically conducting layer is provided over the electrodes, this conductive layer filling the grooves and then being etched throughout its surface until only the part thereof present within the groove(s) remains, this part forming a transfer electrode.

The conductive layer may consist of doped silicon, which will generally be deposited in the form of polycrystalline, at least non-monocrystalline silicon on the subjacent material. After etching this silicon layer, a metal layer of, for example platinum or molybdenum may be applied to it, whereupon at least a part of the silicon present in the grooves is converted into a metal silicide by heating and the non-converted metal is then removed. Instead of silicon, a metal layer of, for example, tungsten, may alternatively be provided in the grooves.

BRIEF DESCRIPTION OF THE DRAWING

Embodiments of the invention will now be described more fully with reference to the drawing, in which.

The Figures are not drawn to scale and for the sake of clarity more particularly the dimensions in the direction of thickness are greatly exaggerated. Corresponding parts in the Figures are generally denoted by the same reference numerals.

DESCRIPTION OF THE PREFERRED EMBODIMENTS

Figure 1:
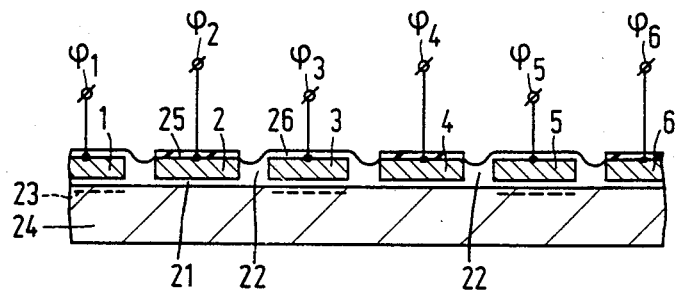
FIG. 1 shows diagrammatically in cross-section a part of a known charge-coupled device.

FIG. 1 shows diagrammatically in cross-section a part of a charge-coupled semiconductor device having a known structure. A part of the CCD register with storage electrodes 1, 3, 5 and transfer electrodes 2, 4 and 6 is represented. Charge can be stored below the storage electrodes, which charge is indicated diagrammatically in the drawing as negative charges. The electrodes are in the form of coplanar silicon strips which are formed from a single silicon layer and are located on an electrically insulating layer 21, generally of silicon oxide, and are mutually separated by grooves 22 filled at least in part with silicon oxide and having a width of at most 1 $\mu$m. The charge is transported (in this example in the form of electrons) along the surface of a p-type conducting layer 24. Due to the method of manufacturing, the electrodes in this example are alternately covered with a layer 25 of silicon nitride (electrodes 2, 4, 6) and with a layer 26 of silicon oxide (electrodes 1, 3, 5). The electrodes are connected through contact windows in the overlying insulating layers to clock voltages $\Psi_1$ to $\Psi_6$. When the electrodes 1, 3, 5 are used as storage electrodes and the electrodes 2, 4, 6 are used as transfer electrodes, the variation of the clock voltages with the time t may be, for example, as indicated diagrammatically in FIG. 3. A semiconductor device of the kind described above and the manufacture thereof are known from U.S. Pat. No. 4,449,278.

Figure 2:
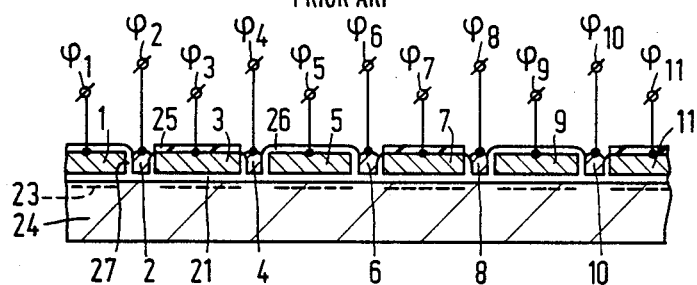
FIG. 2 shows diagrammatically in cross-section the corresponding part of a device in accordance with the invention.
Figure 3:
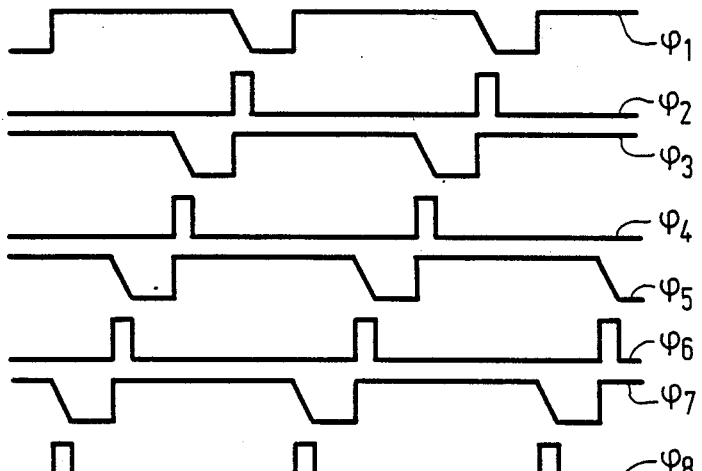
FIG. 3 shows an example of the variation of the clock voltages during operation of a device shown in FIGS. 1 or 2.
Figure 4:
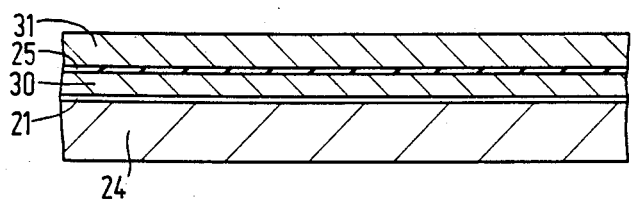
FIGS. 4 to 10 show successive stages of the manufacture of a device in accordance with the invention.

FIG. 2 shows diagrammatically in cross-section a part of a charge-coupled semiconductor device according to the invention. This device essentially has the same construction as that shown in FIG. 1, but with the difference that in this case the grooves situated between two storage electrodes (1, 3, 5, 7, 9) have only superficially oxidized walls 27. For the remaining part, the grooves are filled by a transfer electrode (2, 4, 6, 8, 10) of conductive material. Since the grooves are considerably narrower (<1 $\mu$m) than the storage electrodes located on either side thereof, a comparison of FIGS. 1 and 2 shows that the structure according to the invention, when the storage electrodes have the same width, yields with respect to the storage electrodes a very substantial saving of space. The transfer electrodes in the device according to the invention have a width less than 1 $\mu$m, but this is quite acceptable since they need not be used for charge storage. The electrodes can be driven in the same manner as indicated in FIG. 3.

Although FIG. 2 shows a transfer electrode between each pair of storage electrodes, this is not necessary; there may be storage electrodes between which no tranfer electrode is situated, while at other areas there may also be present a transfer elecrode of larger width. According to the invention, however, at least one transfer electrode is situated within a groove narrower than 1 $\mu$m between two storage electrodes.

The transfer electrodes (2, 4, 6, 8) may be of silicon. They may alternatively consist wholly or in part of a metal silicide or of a metal.

The manufacture of the device according to the invention will now be described more fully with reference to FIGS. 4 to 10.

The starting material (see FIG. 4) is a p-type conducting silicon layer 24 having a doping concentration of, for example, $5\times10^{14}$ atoms/cm$^3$. The charge transport through the charge-coupled device takes place in this layer, which may have a thickness of, for example, 10 $\mu$m and may in turn be situated on a highly doped p-type silicon substrate (although this is not necessary).

An electrically insulating layer 21 is applied to the layer 24. This insulating layer may be, for example, a silicon oxide layer obtained by thermal growth and having a thickness of, for example, 25 nm. On the layer 21 there are successively provided a first silicon layer 30, an oxidation-preventing layer 25 (in this example a silicon nitride layer) and a second silicon layer 31 by the use of known techniques.

In this example, the first silicon layer 30 is a 0.5 $\mu$m thick n-type layer having a doping concentration of $7\times10^{20}$ atoms/cm$^3$. The doping of this layer may take place either simultaneously with the deposition or thereafter by means of diffusion or ion implantation.

The second silicon layer 31 in this example is undoped, that is to say not intentionally doped, and has a thickness of 0.7 $\mu$m. The layer 31 is an auxiliary layer, which is removed at the end of the process.

The layer 25 may alternatively comprise another layer containing silicon nitride, for example silicon oxynitride, or another oxidation-preventing material.

Figure 5:
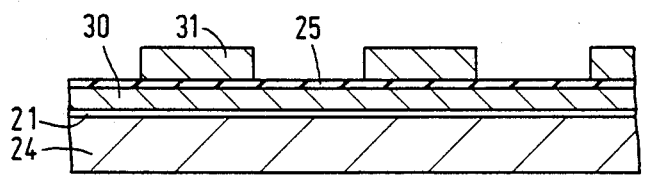

The second silicon layer 31 is then etched according to a pattern comprising a plurality of parallel silicon strips, as a result of which the structure as shown in FIG. 5 is obtained.

Figure 6:
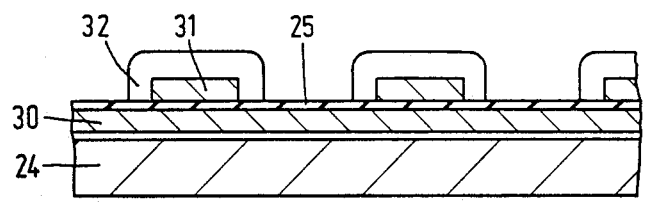
Figure 7:
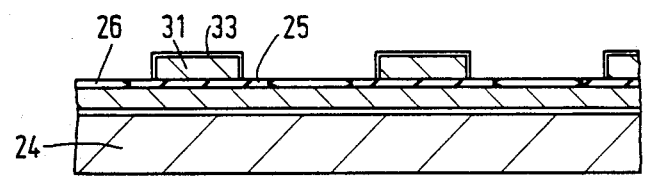

Subsequently, the second silicon layer 31 is partly oxidized (see FIG. 6). An oxidized edge portion 32 of the silicon pattern is then formed, the upper side of the pattern also being oxidized.

Thereafter, the uncovered parts of the oxidation-preventing layer 25 and then the exposed silicon oxide 32 are etched away. Subsequently, a thermal oxidation is carried out at a comparatively low temperature (850° C.) in wet oxygen. Due to the difference in the oxidation rate between differently doped silicon layers, a comparatively thick oxide layer 26 is formed on the highly doped silicon of the layer 30 and only a very thin oxide layer 33 is formed on the un-doped silicon of the layer 31 (see FIG. 7). The thin oxide layer 33 is removed by dip-etching without using a mask, the thick oxide layer 26 being maintained for the major part.

Figure 8:
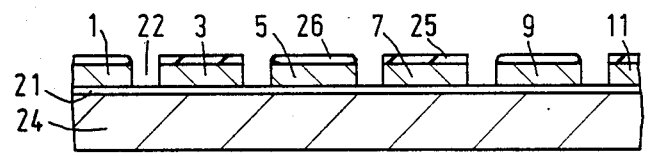
Figure 9:
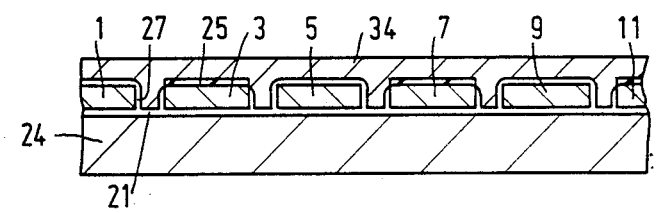
Figure 10:
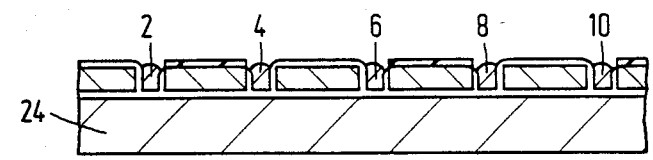

The uncovered parts of the oxidation-preventing layer 25 are now etched away selectively and grooves 22 are etched through the parts of the first silicon layer 30 thus exposed for forming a number of electrodes 2, 3, 5, 7, 9, 11 etc. having a width of about 2 $\mu$m and used for charge transport (see FIG. 8). The second silicon layer 31 than also disappears.

Subsequently, (see FIG. 9), the groove wall is superficially oxidized, a thin oxide layer 27 being formed, which does not fill the groove completely, while the thickness of the oxide 21 on the bottom of the groove remains practically unchanged. If desired, a threshold implantation with, for example, boron ions may be carried out beforehand in the grooves in a self aligned manner.

An electrically conducting layer 34 filling the grooves 22 is now formed over the electrodes. In this example, a layer 34 of silicon is deposited, which is doped, for example, with phosphorus either during deposition or afterwards by diffusion or ion implantation in order to obtain a high conductivity.

Subsequently, the layer 34 is etched throughout its surface by etching, for example by reactive ion etching (RIE) or sputter etching or by other etching methods, until only the part thereof present within the grooves 22 remains. These parts located within the grooves then form transfer electrodes 2, 4, 6, 8, 10 etc. (see FIG. 10).

The invention has now been described in principle. A problem may be formed by the process of contacting the very narrow transfer electrodes. A method will now be described by which in a comparatively simple manner simultaneously contacts can be formed on the transfer electrodes and on the electrodes originally covered with silicon nitride (or another anti-oxidation layer) in a self-aligned manner. The contact windows on the electrodes covered with oxide may then be formed, for example, on widened ends thereof.

The starting point is the situation shown in FIG. 8, in which electrodes mutually separated by grooves 22 and alternately covered with silicon oxide 26 and with silicon nitride (or another anti-oxidation layer) 25 are obtained. A diagrammatic plan view is shown in FIG. 11, in which a contact to be formed on a transfer electrode (4) and a contact to be formed on an electrode (7) originally covered with nitride are indicated by diagonal lines.

Figure 11:
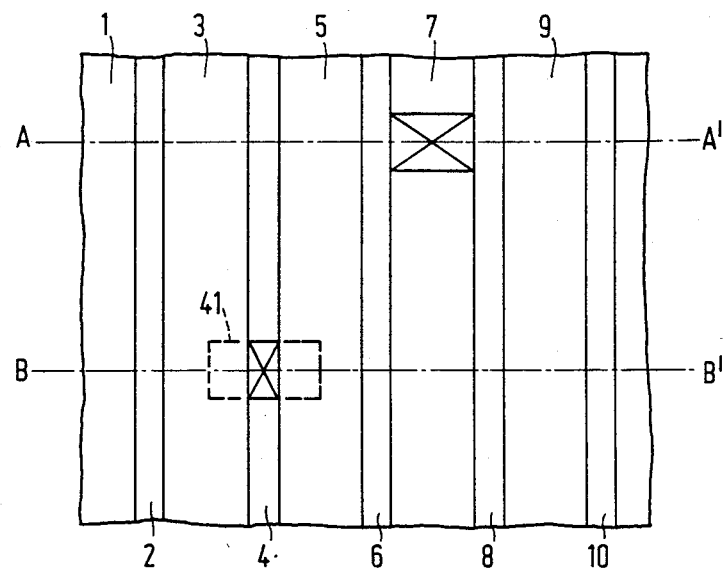
FIGS. 11 to 15 show in plan view and diagrammatically in cross-section successive stages of a method of forming contacts on the electrodes of a device in accordance with the invention.

FIGS. 12 to 15 show diagrammatically in cross-section successive stages of the contacting process, in which the cross-sections denoted by A correspond to the line AA' and the cross-sections denoted by B correspond to the line BB' of FIG. 11.

Figure 12:
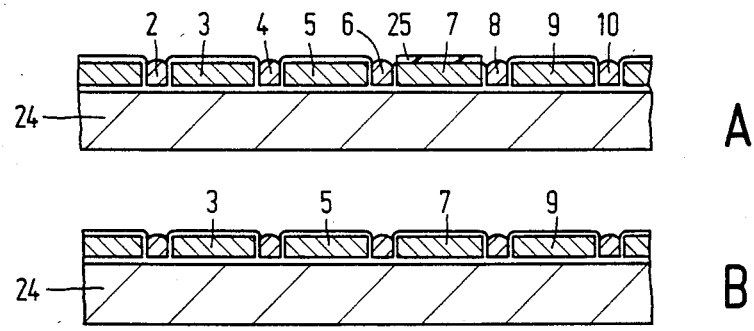

First the anti-oxidation layer 25 is removed by etching except in the areas at which contacts have to be formed on the electrodes covered by this layer. Subsequently, the grooves and the exposed parts of the electrodes are oxidized, whereupon the transfer electrodes are provided in the grooves in the same manner as described with reference to FIGS. 9 and 10. Thus, the situation shown in FIG. 12 is obtained. At this stage, if desired, as already described, the transfer electrodes may be converted wholly or in part into a metal silicide.

Figure 13:
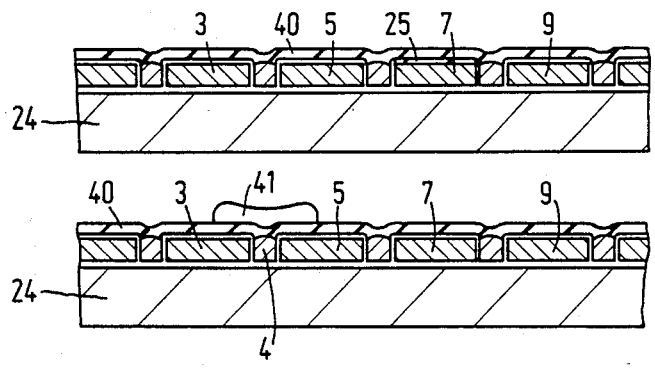
Figure 14:
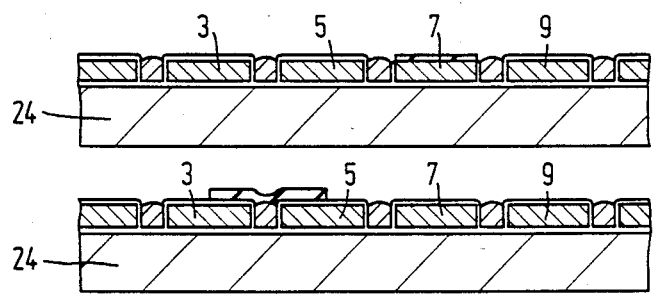

Now a new layer (40) of silicon nitride is deposited on the assembly (see FIG. 13). At the area of the cross-section AA' a double layer (25+40) of silicon nitride is present on the electrode 7. At the area at which a contact has to be provided on the transfer electrode 4, the nitride layer 40 is covered with a mask 41 of photolacquer, which also extends over the adjacent electrodes 3 and 5 (see FIG. 13B). The circumference of this photo-lacquer mask is indicated by dotted lines in FIG. 11.

The silicon nitride layer 40 is then etched away selectively, the etching process being continued until the layer 40 has entirely disappeared outside the photolacquer mask 41 and the layer 25 has disappeared at most partially. After removal of the photolacquer mask 41, silicon nitride is still present only at the contact areas (see FIG. 14).

Figure 15:
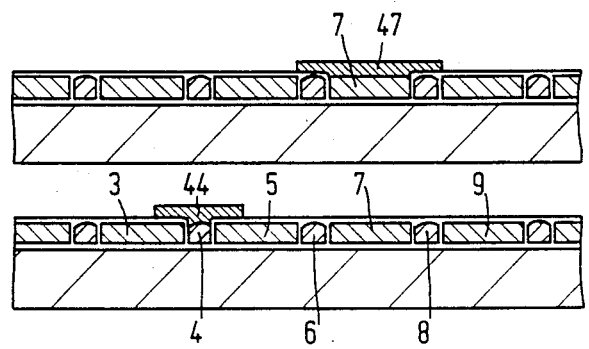

Subsequently, the transfer electrodes are oxidized, after which the remaining silicon nitride is removed and metal layers 47 and 44 are provided on the silicon parts thus exposed (see FIG. 15).

In the description given here, only the storage and transfer electrodes of a charge-coupled device have been mentioned. This device generally comprises further parts, such as, for example, source and drain zones and source and drain electrodes; since the structure and manufacture thereof are not essential to the present invention, they have not been described herein.

The invention is not limited to the embodiment described. More particularly, the electrodes may be contacted in a manner different from that described herein. Furthermore, instead of silicon nitride, other oxidation-preventing materials, for instance aluminum oxide, may be used for the layers 25 and 40 provided that they can be etched selectively with respect to silicon oxide (and vice versa).

What is claimed is:

1. A charge-coupled semiconductor device having a semiconductor substrate, a silicon oxide insulating layer on said substrate, and a plurality of electrodes for storing and transporting information-carrying charge, said electrodes comprising coplanar silicon strips located on said insulating layer and mutually separated by grooves having groove walls, said grooves being filled at least in part with silicon oxide and said grooves having a width between said walls of at most 1 μm, said grooves being narrower than said silicon strips, the grooves being situated between storage electrodes, between at least two storage electrodes the groove wall being only superficially oxidized and the groove being further filled by a transfer electrode comprising conductive material and having a width of at most 1 μm, the insulating layer under the transfer electrodes having a thickness substantially equal to that under the storage electrodes and said transfer electrode being substantially coplanar with said storage electrodes.

2. A charge-coupled semiconductor device as claimed in claim 1, characterized in that the transfer electrode comprises of silicon.

3. A charge-coupled semiconductor device as claimed in claim 1, characterized in that the transfer electrode comprises at least partly a metal silicide.

4. A charge-coupled semiconductor device as claimed in claim 1, characterized in that the transfer electrode contains a metal.

* * * * *